(12) United States Patent
Hughes

(10) Patent No.: US 6,403,881 B1
(45) Date of Patent: Jun. 11, 2002

(54) ELECTRONIC COMPONENT PACKAGE ASSEMBLY AND METHOD OF MANUFACTURING THE SAME

(75) Inventor: John E Hughes, South Ascot (GB)

(73) Assignee: Elliott Industries, Ltd. (GB)

( * ) Notice: Subject to any disclaimer, the term of this patent is extended or adjusted under 35 U.S.C. 154(b) by 0 days.

(21) Appl. No.: 09/383,748

(22) Filed: Aug. 26, 1999

(30) Foreign Application Priority Data

Aug. 26, 1998 (GB) .............................................. 9818474

(51) Int. Cl.$^7$ ................................................. H05K 5/06
(52) U.S. Cl. ...................................... 174/52.3; 257/704
(58) Field of Search .................... 174/52.3; 257/704, 257/778, 789, 794, 796

(56) References Cited

U.S. PATENT DOCUMENTS

| | | | | |
|---|---|---|---|---|
| 5,473,191 A | * | 12/1995 | Tanaka | 257/680 |
| 5,734,155 A | * | 3/1998 | Rostoker | 250/208.1 |
| 5,827,755 A | * | 10/1998 | Tonehara et al. | 438/30 |
| 6,194,782 B1 | * | 2/2001 | Katchmar | 257/738 |

* cited by examiner

Primary Examiner—Peter S. Wong
Assistant Examiner—Gary L. Laxton
(74) Attorney, Agent, or Firm—ipsolon LLP

(57) ABSTRACT

An electronic component package assembly includes a substantially planar base substrate having a plurality of cavities each defined by a frame; an electronic component attached to the base substrate within each cavity; and a lid fixed to the frame such that, in combination, the base, the lid and each frame define an enclosed volume housing the electronic component.

20 Claims, 3 Drawing Sheets

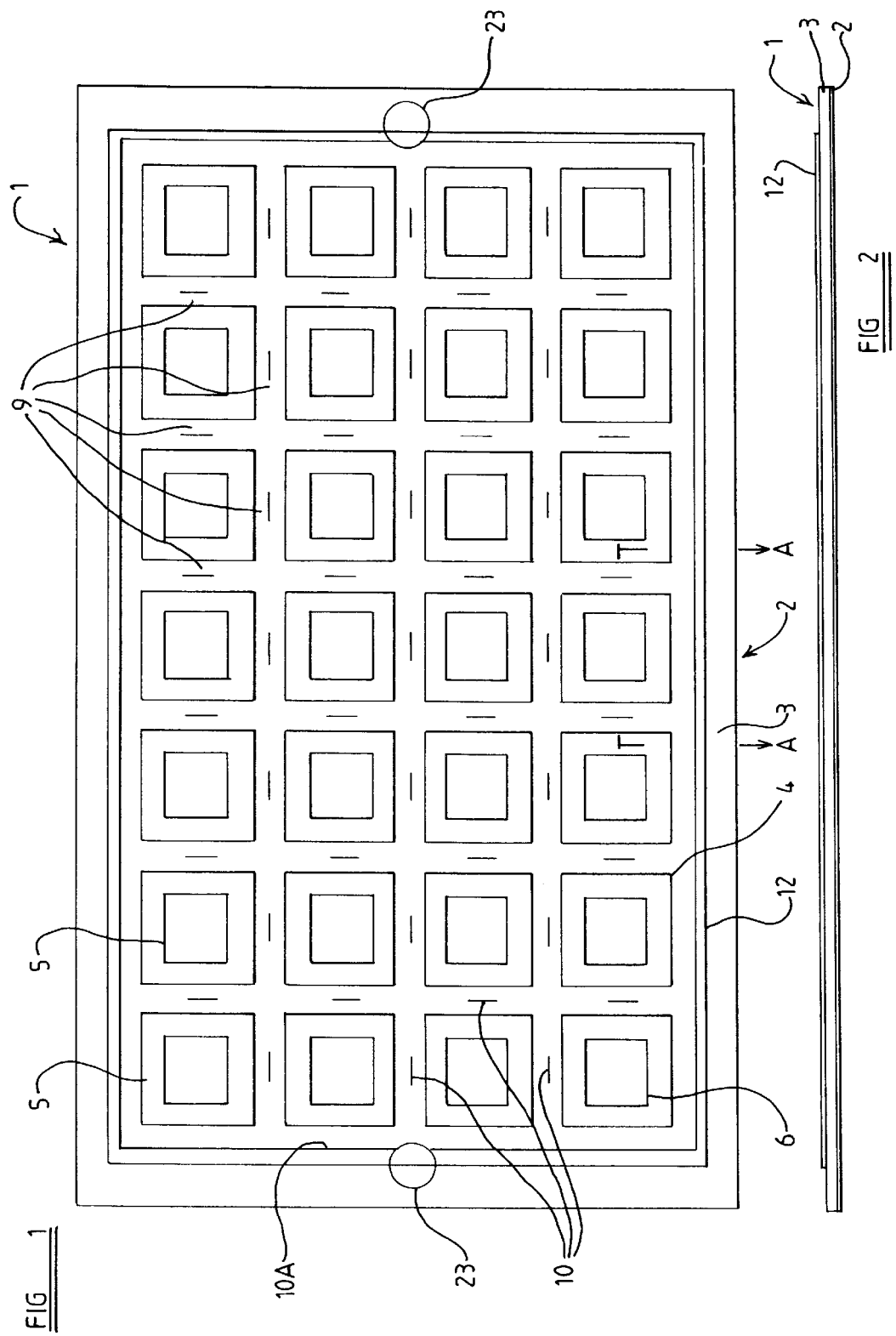

ELECTRONIC COMPONENT PACKAGE ASSEMBLY AND METHOD OF MANUFACTURING THE SAME

This invention relates to an electronic component package assembly and method of manufacturing the same. More particularly, the invention relates to a packaging assembly for semiconductor chips and other electrical components including optical electronic components requiring an optical lid.

Most integrated circuits and discrete semiconductor devices are provided in standard package forms such as DIL (Dual-in-Line) and T018 packages. These types of packages need through holes in a printed circuit board for the their pins or leads to protrude through and to be soldered on the underside of the board to make both electrical and mechanical connection to the board and the tracks on the board.

Surface mount assembly technology has been developed in which packaged components do not have pins or leads. Instead, the packaged component is placed on a surface of a circuit board, on either side of the board or both sides of the board. Surface mount assembly is regarded as a more refined process than through hole assembly techniques. Finer pitch contacts are possible coupled with the fact that all four sides of a component package are usable thus enabling packages to be smaller with typical space savings in the region of 4:1 when comparing through hole assembly techniques with surface mount assembly techniques.

Even taking into account the savings in assembly board areas which surface mount assembly techniques provide, the trend has been to increase the density of components which populate a board thereby leaving the component package with higher pin counts which can be up to several hundred pins.

In the past, some components were used in die or naked form (i.e. unpackaged) in what are called hybrid circuits. Such unpackaged components were usually placed on a ceramics substrate along with necessary tracks, resistors and capacitors. The process for manufacturing the tracks, resistors and some capacitors is known as "print and fire". The "print and fire" technique is especially useful where reproductability of size and weight are critical or power dissipation is high. However, the "print and fire" process is expensive and the requirements of most applications can be met using surface mount assembly technology.

Pin counts are continuing to rise and are set to increase on average two or three times every five years. One technology which has been developed to help with the high pin count problems is Multi-Chip Modules (MCMs). This technology is also of assistance when dealing with the higher clock speeds now being used in the electronics industry. MCM technology basically packages the high pin count chips that need to interconnect with one another onto a dedicated substrate which can be silicon, alumina or a laminate. The substrate is then put into a package with a more conventional pin pitch for example 1.27 mm or 2.54 mm to form a chip. The chips used are usually in unpackaged (die/naked) form, although some very small packaged components can also be used within MCMs. The main concept is to have the critical, fast high pin count and high interconnect density circuitry in one or more special MCM assemblies which can then be fitted onto more conventional assemblies.

MCM technology is still very costly due to the special materials and assembly required. The final size of an MCM is governed by the package size of the overall module which is a function of the number of "out" pins which the module is required to possess and the interconnect density capability required within the MCM. This last factor is dependent on the line spacing capability and chip to substrate connection method within the module.

The types of interconnection possible between an electronic component and a substrate and/or a package are wire bonding, tape automated bonding and flip-chip which each have their own advantages and disadvantages. In high density assemblies, the power dissipation and the capability to remove heat generated thereby is an important factor.

With the advent of multi-media computerisation and the Internet as well as a general high growth in optical devices, there is now a need to produce high volume low cost optical packages and interconnects which are capable of being multi-component and used in surface mount technologies and which have automatic handling capability.

It is an object of this invention to provide a high density surface mount interconnect package for optical devices such as sensors and displays which can be used within MCM at one extreme or as a simple package electronic component at the other extreme.

It is further object of the invention to provide an electronic component package assembly constructed in arrays.

It is a further object of the invention to provide an economical electronic components package assembly and method of making the same.

Another object of the present invention is to reduce the size of electronic component packages compared to the package sizes required for other technologies.

Accordingly, one aspect of the present invention provides an electronic component package assembly comprising: a substantially planar base carrying a number of cavities each defined by a frame; an electronic component attached to the base within each cavity; and a lid fixed to the frame such that, in combination, the base, the lid and each frame define an enclosed volume housing the electronic component.

Conveniently, a plurality of tiles are derived from a single panel comprising a base layer attached to a frame layer.

Conveniently, the lid is manufactured from a transparent material.

Advantageously, at least one raised portion is upstanding above each frame to ensure the lid is spaced from the frame by a predetermined gap, the gap being filled with an adhesive to fix the lid of the frame.

Preferably, the enclosed volume housing the electronic component is at least partly filled with a protective compound.

Advantageously, the electronic component is a flip-chip, the base being formed with a cut-out substantially adjacent an optical surface of the chip, the cut-out being covered with a transparent material.

Another aspect of the present invention provides a method of manufacturing a package for an electronic component comprising the steps of:

providing a substantially planar base having a number of cavities each defined by a frame; attaching an electronic component to the base within each frame;

fixing a lid to the frames such that, in combination, the base, the lid and each frame define an enclosed volume housing the electronic component; and separating from the assembly a number of packages each having a base portion, an electronic component attached to the base, a frame surrounding the electronic component and a lid portion fixed to the frame.

In order that the present invention may be readily understood, embodiments thereof will now be described, by way of example, with reference to the accompanying drawings in which:

FIG. 1 is a top view of a tile including package assemblies embodying the present invention;

FIG. 2 is a side view of the tile of FIG. 1;

Figure 3:
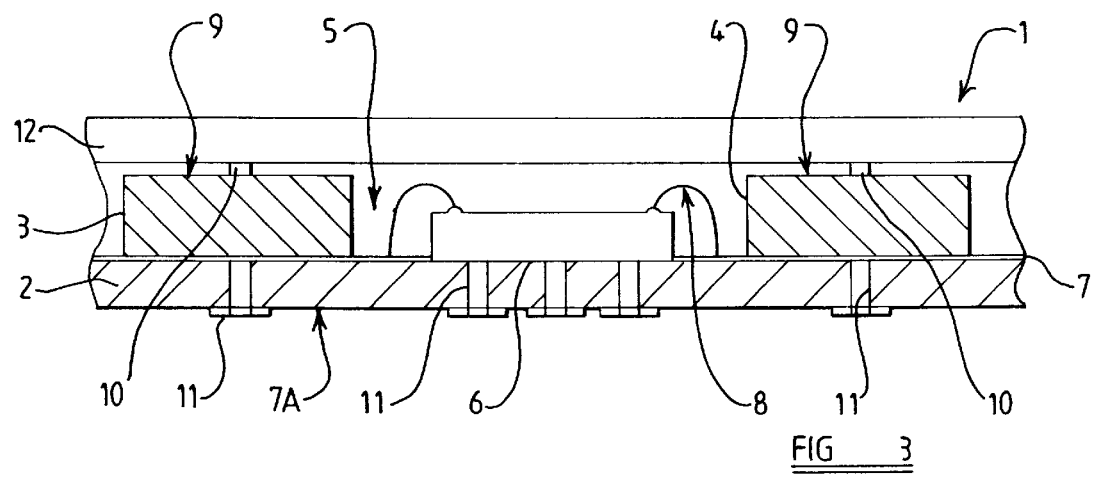
FIG. 3 is a detailed cross-section taken along line A—A of FIG. 1 showing an electronic component package assembly embodying the present invention forming part of the tile of FIG. 1.

Referring to the figures, an electronic component package assembly and method of manufacturing the same will now be described.

An electronic component package assembly embodying the present invention is produced in the form of a panel similar to panels which are used in the manufacture of printed circuit boards. Several hundred packages are accommodated on each panel. The packages are arranged on the panels in the form of several arrays. In one example, each array is a matrix of 4×7 packages. Each of these arrays is termed a tile. An example of a tile 1 forming part of a panel (not shown) is shown in FIGS. 1 and 2.

A panel comprises a rectangular base substrate 2 of a suitable laminate material such as those commonly used in multi-layer printed circuit boards. The base substrate 2 is metallised on both main surfaces and etched and plated. A second laminate material or frame layer 3 has a single metallised surface. The non-metallised surface of the frame layer 3 is bonded to the base substrate 2. The frame layer 3 is provided with a plurality of substantially square cut-outs 4 in the form of an array. Once the frame layer 3 has been bonded to the base substrate 2, a plurality of tiles 1 are routed out from the panel and after cleaning operations, are ready for subsequently operations such as die attachment and wire bonding. The two layers 2,3 are bonded together in a conventional multi-layer press with post drilling and other operations as required.

In the example shown in FIG. 1, a resultant tile 1 has an array of cut-outs in a matrix of 4×7. Thus, the cut-outs 4 in each tile 1 provide an array of cavities 5 which are capable of receiving an electronic component such as a die therein. As can be seen in FIGS. 1 and 3, an electronic component 6 is located squarely within each cavity 5 and is seated on the rectangular substrate 2. Preferably, as shown clearly in FIG. 3, the electro-component 6 is wire bonded to the etched and plated electrical conducting surface 7 carried on the rectangular substrate 2. In the example shown in FIG. 3, the wire bonds 8 connect directly to the etched and plated electrical conducting surface 7. The wire bonds 8 also connect indirectly to other etched conducting surfaces 7A formed on the package through inter-connects in the substrate 2.

Referring back to FIG. 1, the frame layer 3 provides a number of strips 9 which separate adjacent cavities 5. Each such strip 9 is provided with an upstanding lip 10 which runs part way along the strip 9, in parallel therewith. The upstanding lips 10 (or stand-offs) have a predetermined height which is in the order of 0.1 mm. A continuous stand-off 10A is also formed around the perimeter of the tile 1. The stand-offs 10,10A are preferably formed on the frame layer 3 prior to bonding to the base substrate 2 by etching and plating, the stand-offs 10,10A thereby being metallised portions.

The rectangular substrate 2 is conveniently provided with a plurality of vias 11 which serve to inter-connect the various conductive layers within the laminate substrate 2. Similar vias 11 may also be formed in the frame layer 3. As well as providing an inter-connect function, the vias 11 can also be used as thermal vias to conduct heat away from the electrical component 6 to an external pad to which further heat sinks can be attached. If the electronic component 6 does not dissipate too much heat and/or the maximum temperature range of operation thereof in not too high (for example less than 85 degrees C.) then thermal vias may not be necessary.

The cavity 5 within which each electronic component 6 is mounted is filled or partly filled with a protective compound such as a low viscosity UV-cured acrylic.

Referring now to FIG. 3, each tile 1 is fitted with a glass lid 12. The glass lid 12 sits squarely on the frame layer 3 and is supported thereon by the upstanding lips 10 such that the glass lid 12 is spaced apart from the frame layer 3 by a gap of a predetermined thickness. Conveniently, the glass lid 12 is glued to the frame layer 3, the upstanding lips 10 ensuring that the glass lid 12 is properly spaced apart from the frame layer 3. An example of a particular method of manufacture of the tile 1 shown in FIGS. 1 to 3 is described below.

The glass lid 12 can be modified in a number of ways to produce a selected transmissivity. Thus, the glass lid 12 can be configured as a filter to filter light in pre-selected ranges. The resultant package 13 and method of manufacturing the same are especially suited to the provision of an opto-electronic component as the electronic component 6. The provision of the glass lid 12 is not, however, an essential feature when the package is to be used in non-optical applications.

The resultant product comprises a tile 1 which carries an array of packages 13. Each package 13 comprises an electronic component 6 packaged within and bounded by a base substrate 2, a plurality of side walls formed by the second substrate material 3 and a lid 12. The electronic component 6 is wire bonded to the package 13 and protectively encased therein. The tiles 1 can then be broken down into individual packages when the various production steps have been completed. Thus, the use of tiles provides a very efficient handling system rather than having to handle small single packages.

Figure 5:
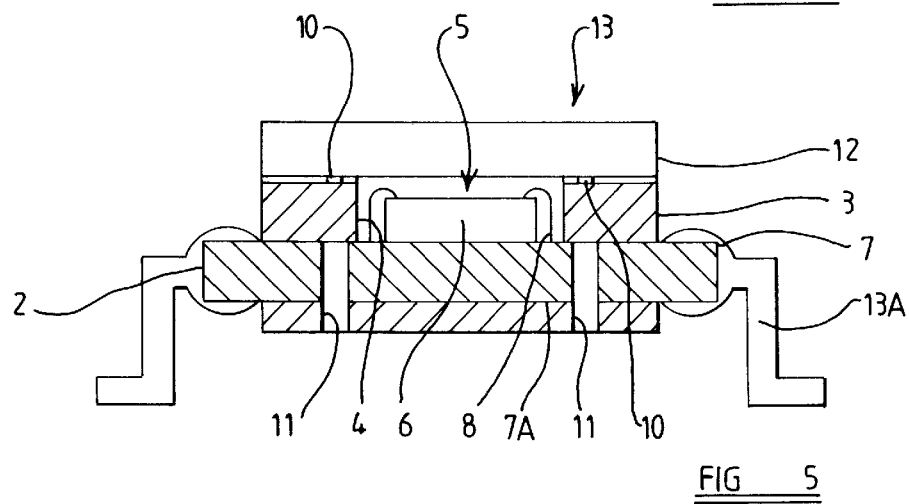
FIG. 5 is a cross-sectional side view of an electronic component package assembly embodying the present invention in the form of an SO package.
Figure 6:
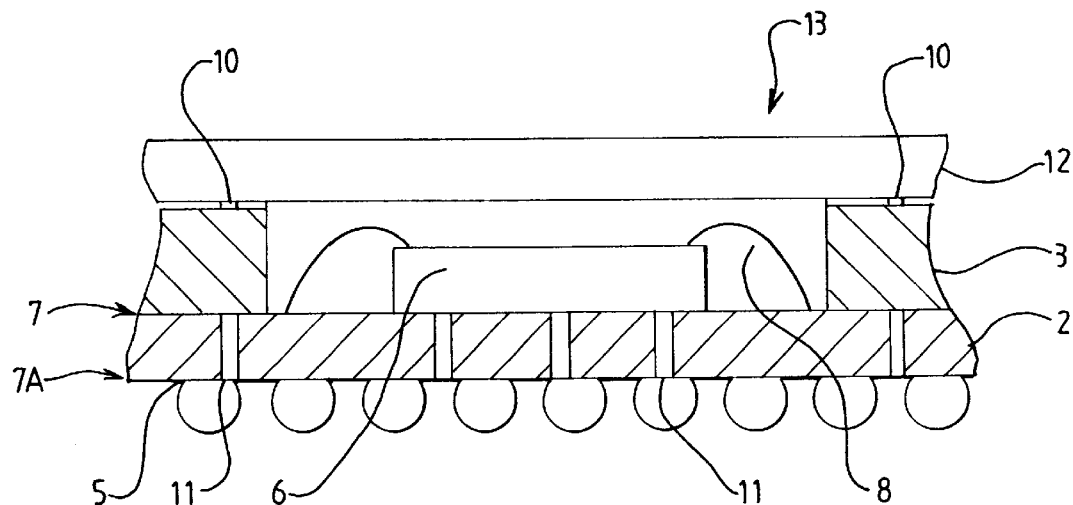
FIG. 6 is a cross-sectional side view of an electronic component package assembly embodying the present invention in the form of a Ball Grid Array (BGA)

Once the packages 13 have been divided or separated from the tiles 1, they can be embodied into conventional package forms such as surface mount chip carriers, a DIL package 13 having pins or legs 13A as shown in FIG. 5 or a ball grid array (BGA) package 13 as shown in FIG. 6.

Figure 4:
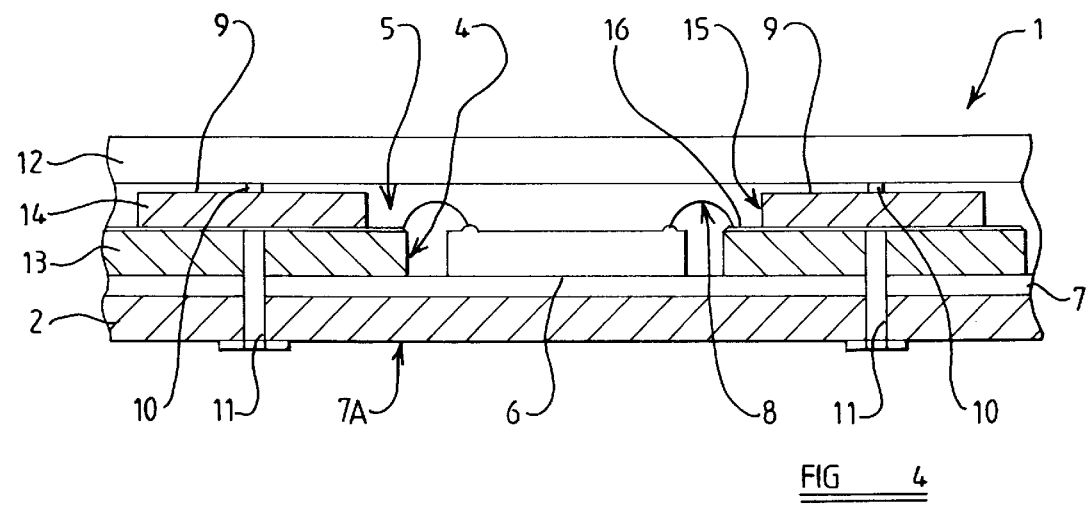
FIG. 4 is a cross-sectional side view of a further electronic component package assembly embodying the present invention and forming part of a tile.

Referring to FIG. 4, the structure of the tile 1 can be modified to include further laminate materials. In the example shown in FIG. 4, a further laminate material 14 is provided on the existing frame layer 3. The further laminate material 14 is formed with cut-outs 15 which are concentric with the cut-outs 4 formed in the frame layer 3. As can be appreciated from FIG. 4, the electronic component 6 is wire bonded to an etched conductive surface provided to a step 16 on the frame layer 3. In this embodiment, the upstanding lips 10 are provided on the further laminate material 14. Vias 11 are provided in the respective laminate materials so as to inter-connect the electrically conducting portions thereof.

In the example shown in FIG. 4, the etched conductive layer 7 provided on the base substrate 2 can be made thicker than usual so as to act as a thermal conducting plane to dissipate heat from the electronic component 6. Clearly, the thermal resistance of the conductive layer 7 will depend on the thickness of the layer and the width and lengths of the conducting paths. If further sinking of heat is required, then conductive layer 7 can be clamped or connected to other external heat sinks.

It should be appreciated that because the packages 13 are provided in the form of an array of packages 13 on a tile 1, automated handling of the tile 1 is facilitated. It is far easier to handle a tile comprising a fixed array of packages rather than a single package 13. The use of the tile 1 allows accurate alignment during automated stages of production such as the attachment of the electronic component 6 to the tile 1, the wire bonding step, the step of fixing the lid 12 and the step of separating the packages 13 from the tile 1.

Figure 7:
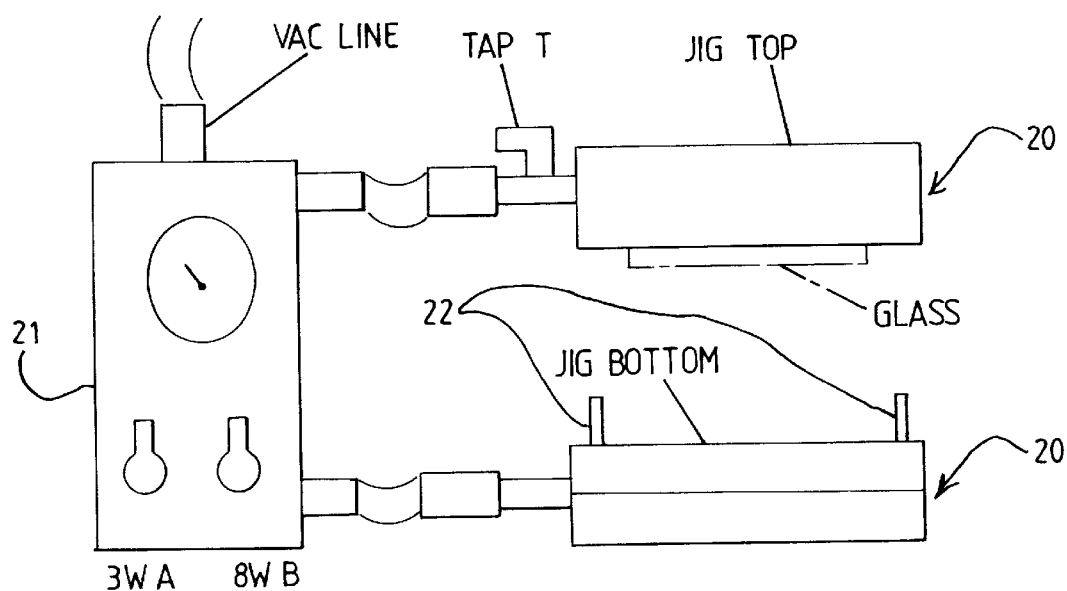
FIG. 7 is a schematic representation of an apparatus for manufacturing an electronic component package assembly embodying the present invention.

Turning to the particular manufacturing steps for a package 13 and referring to FIG. 7, the base substrate 2 is provided and the laminate material 3, complete with cut-outs 4, is glued thereto. The resultant tile 1 provides a plurality of cavities 5 each of which is provided with an electronic component 6. The electronic component is glued to the base substrate 2 (preferably to the etched conductive layer thereon) by one of a number of adhesives commonly used in the semiconductor industry such as, for example, epoxy, polymide and thermoset plastics.

The electronic component 6 is then wire bonded to a conductive layer or layers within the cavity. Preferably, gold or aluminium wire is used in the wire bonding process using thermosonic or ultrasonic welding techniques. However, it is also possible to use, with modification, tape automated bonding or flip-chip attachments with this invention.

After wire bonding, the cavity 5 is filled or part filled with a protective compound such as a low viscosity UV-cured acrylic. The protective compound serves to provide structural stability within the package 13.

Glue is provided along the strips 9 running between adjacent cavities 5 and around the perimeter of the frame layer 3. The glue covers the strips 9 and the perimeter and provides a bead of glue which is slightly greater in thickness than the height of the upstanding lips 10.

In this condition, the assembled tile 1 is located on the base of a sealing jig 20 which is connected to a vacuum 21. The base of the sealing jig 20 has two locating pins 22 upstanding therefrom. The two pins 22 are of slightly different sizes. Each end of the assembled tile 1 is provided with a locating hole 23 (see FIG. 1). Preferably, the holes 23 are of slightly different sizes such that the tile 1 can only be inserted in one orientation on the base of sealing jig 20. The tile 1 is inserted on the base of the sealing jig 20 with the two locating pins 22 from the base passing through the locating holes 23 in the tile 1.

The glass lid 12 is presented to the top of the sealing jig 20 and is held thereto by vacuum pressure provided by the vacuum 21. The top of the jig 20 is presented to the base of the jig 20 such that the glass lid 12 is immediately above and registered with the frame layer 3. The glass lid 12 is dropped onto the tile 1 below. The upstanding lips 10 ensure that the glass lid 12 is spaced apart from the frame layer 3 by the desired distance to ensure that the glue properly adheres the glass lid 12 to the frame layer 3. Once the glue has wetted to the glass lid, a small back pressure is applied by the top jig to push the glass lid onto the upstanding lips 10. The upstanding lips 10 ensure that the correct thickness of glue is maintained uniformly across the tile 1. Whilst still in the jig 20, the glass is secured by curing the glue, preferably a low viscosity UV-cured acrylic, by exposure to ultraviolet light. The vacuum is then released and the tile 1 is removed for the final stage of package separation.

In the package separation stage, the individual packages 13 are cut from the tile 1 by cutting along the centres of the strips 9 separating adjacent cavities 5—i.e. along the lines defined by the upstanding lips 10. The vias 11 are also located such that their centres fall along the cut line thus forming castellations down to the bottom metal layer 7A on which the package footprint has been formed. The castellations are used for solder paste soldering connections. The cut-outs 4 in the frame layer provide a frame around each of the electronic components.

It is also envisaged that further wire bonding sites can be provided within each cavity 5 by providing multiple steps in the cavity walls, i.e. on the sides of the package frame in a similar manner to the step 16 shown in FIG. 4.

Whilst specific embodiments of packages are shown in FIGS. 5 and 6, it will be apparent to those in the industry and skilled in the art of PCB manufacture, that numerous versions are possible whilst adhering to the basic principles of the invention.

It is envisaged that, in an alternative embodiment, the cavities 5 can be milled out from a single laminate material although this is not preferred.

In a flip-chip embodiment of the present invention, the face of the flip-chip 6 is attached to the base 2, both mechanically and electrically, by means of a plurality of micro-balls located around the periphery of the face of the chip 6. In the case of the chip 6 being an electro-optical chip, the base 2 is formed with a cut-out. The cut-out is located substantially adjacent an optical surface of the chip and is covered with a glass lid or insert. In this embodiment, the lid 12 need not be made from a transparent material and is preferably pre-bonded to the frame layer 3 prior to attachment to the base 2, the flip-chip having already been attached to the base 2.

In the present specification "comprise" means "includes or consists of " and "comprising" means "including or consisting of".

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

What is claimed is:

1. An electronic component package assembly separable into a plurality of electronic component packages, the package assembly comprising:
   a substantially planar base substrate;
   a frame layer comprising a laminate material formed with a plurality of cavities, the frame layer being attached to the planar base substrate, and a raised member upstanding from the frame layer;
   a plurality of electronic components, each component being attached to the base substrate within one of the plurality of cavities; and
   a lid covering and spaced apart from the frame layer by the raised member to create a predetermined gap between the lid and the frame layer, wherein the gap is filled with an adhesive to fix the lid to the frame layer such that, in combination, the base substrate, the lid and each of the cavities in the frame layer define a plurality of electronic component packages each of which is separable from the electronic component package assembly and has an enclosed volume which houses one of the electronic components.

2. A package assembly according to claim 1, wherein the cavities are arranged in an array in the frame layer.

3. A package assembly according to claim 1, wherein the base substrate comprises further layers of a laminate material.

4. A package assembly according to claim 1, wherein the frame layer comprises one or more layers of a laminate material.

5. A package assembly according to claim 1, wherein each cavity is of a substantially rectangular configuration.

6. A package assembly according to claim 1, wherein the lid is manufactured from a transparent material.

7. A package assembly according to claim 6, wherein the transparent material has a selected transmissivity.

8. A package assembly according to claim 6, wherein the electronic components are optical devices.

9. A package assembly according to claim 1, wherein the lid is manufactured from glass.

10. A package assembly according to claim 1, wherein each of the enclosed volumes housing one of the electronic components also includes a protective compound.

11. A package assembly according to claim 10, wherein the protective compound is a UV-cured acrylic.

12. A package assembly according to claim 1, wherein the base substrate has at least one etched electrically conducting surface and the electronic components are electrically connected to the surface.

13. A package assembly according to claim 1, wherein the frame layer has at least one etched surface.

14. A package assembly according to claim 1, wherein the base substrate includes a plurality of conducting layers and at least one via to interconnect the conducting layers through the base substrate.

15. A package assembly according to claim 1, wherein the frame layer has a plurality of conducting layers and at least one via to interconnect the conducting layers through the frame layer.

16. A package assembly according to claim 1, wherein thermal vias are provided through the base substrate to dissipate heat from the electronic components.

17. A package according to claim 1, wherein the electronic components are flip-chips each of which has an optical surface, the base substrate being formed with a plurality of cut-outs each of which is substantially adjacent the optical surface of a respective flip-chip, the cut-outs being covered with a transparent material.

18. The assembly of claim 17 further comprising a via formed through the substrate and centered along the cut line.

19. A method of manufacturing an electronic component package, the method comprising the steps of:

providing a substantially planar base substrate and a frame layer comprising a laminate material formed with a plurality of cavities, and a raised member upstanding from the frame layer;

attaching the frame layer to the planar base substrate;

attaching a plurality of electronic components to the base substrate, each component being attached to the base substrate within one of the plurality of cavities;

locating a lid over the frame layer and spaced apart from the frame layer by the raised member to create a predetermined gap between the lid and the frame layer;

filling the gap with an adhesive to fix the lid to the frame thereby producing an electronic component package assembly such that, in combination, the base substrate, the lid and each of the cavities in the frame layer define a plurality of electronic component packages each of which is separable from the electronic component package assembly and has an enclosed volume which houses one of the electronic components; and separating from the electronic component package assembly a plurality of electronic component packages.

20. The assembly of claim 1 wherein the raised member is located in alignment with a cut line, along which cut line an electronic component package is separable from the assembly.

* * * * *